United States Patent
Ross

(10) Patent No.: US 11,977,770 B2
(45) Date of Patent: May 7, 2024

(54) METHODS FOR GENERATING NOTIFICATIONS FOR UPDATED INFORMATION FROM MODE REGISTERS OF A MEMORY DEVICE TO A HOST AND MEMORY DEVICES AND SYSTEMS EMPLOYING THE SAME

(71) Applicant: Lodestar Licensing Group LLC, Evanston, IL (US)

(72) Inventor: Frank F. Ross, Boise, ID (US)

(*) Notice: Subject to any disclaimer, the term of this patent is extended or adjusted under 35 U.S.C. 154(b) by 19 days.

(21) Appl. No.: 16/029,253

(22) Filed: Jul. 6, 2018

(65) Prior Publication Data
US 2019/0369914 A1    Dec. 5, 2019

Related U.S. Application Data

(60) Provisional application No. 62/680,434, filed on Jun. 4, 2018.

(51) Int. Cl.
*G06F 3/06* (2006.01)
*G11C 11/4093* (2006.01)

(52) U.S. Cl.
CPC .......... *G06F 3/0659* (2013.01); *G06F 3/0604* (2013.01); *G06F 3/0634* (2013.01); *G06F 3/0653* (2013.01); *G06F 3/0673* (2013.01); *G11C 11/4093* (2013.01)

(58) Field of Classification Search
CPC .... G06F 3/0659; G06F 3/0673; G06F 3/0604; G06F 3/0634; G06F 3/0653; G11C 11/4093; G11C 7/1045; G11C 7/109; G11C 8/12; G11C 11/4076; G11C 7/1006; G11C 7/04; G11C 11/40626

USPC ..... 365/222, 185.25; 711/106, 105; 714/754
See application file for complete search history.

(56) References Cited

U.S. PATENT DOCUMENTS

| 9,767,921 | B1 | 9/2017 | Pan |
| 9,911,485 | B2 | 3/2018 | Sriramagiri et al. |
| 2004/0128429 | A1* | 7/2004 | Khandekar ............ G11C 5/04 711/101 |
| 2006/0221718 | A1 | 10/2006 | Ono |

(Continued)

FOREIGN PATENT DOCUMENTS

CN        104778974 A    7/2015

OTHER PUBLICATIONS

International Application No. PCT/US2018/046890—International Search Report and Written Opinion, dated May 7, 2020, 11 pages.

(Continued)

*Primary Examiner* — William E. Baughman
(74) *Attorney, Agent, or Firm* — Holland & Hart LLP

(57) ABSTRACT

Memory devices, memory systems, and methods of operating memory devices and systems are disclosed in which a memory device can asynchronously indicate to a connected host that information in a mode register has been changed, obviating the need for repeated polling of the information and thereby reducing both command/address bus and data bus bandwidth consumption. In one embodiment, a memory device comprises a memory; a mode register storing information corresponding to the memory; and circuitry configured to, in response to the information in the mode register being modified by the memory device, generate a notification to a connected host device.

20 Claims, 5 Drawing Sheets

(56) References Cited

U.S. PATENT DOCUMENTS

| | | | |
|---|---|---|---|
| 2013/0311717 A1 | 11/2013 | Kim et al. | |
| 2014/0258786 A1* | 9/2014 | Resnick | G11C 7/1006 |
| | | | 714/42 |
| 2015/0134897 A1* | 5/2015 | Sriramagiri | G11C 11/406 |
| | | | 711/106 |
| 2015/0170725 A1* | 6/2015 | Kwak | G11C 7/1066 |
| | | | 365/189.05 |
| 2015/0256153 A1 | 9/2015 | Lim et al. | |
| 2016/0180921 A1* | 6/2016 | Jeong | G11C 7/00 |
| | | | 365/222 |
| 2016/0224272 A1 | 8/2016 | Kim | |
| 2016/0284386 A1* | 9/2016 | McCall | G06F 11/3037 |
| 2017/0083259 A1* | 3/2017 | Lee | G11C 11/40626 |
| 2017/0110178 A1 | 4/2017 | Bains | |
| 2017/0132075 A1 | 5/2017 | Zastrow | |
| 2017/0140810 A1* | 5/2017 | Choi | G11C 11/40607 |
| 2017/0308433 A1 | 10/2017 | Kwon et al. | |
| 2018/0101204 A1* | 4/2018 | Fackenthal | G06F 1/206 |
| 2018/0197599 A1* | 7/2018 | Choi | G11C 14/0009 |
| 2018/0284386 A1 | 10/2018 | Huang et al. | |
| 2019/0043557 A1* | 2/2019 | Cox | G11C 11/40615 |
| 2019/0095361 A1* | 3/2019 | Morris | G06F 13/1689 |
| 2019/0147939 A1* | 5/2019 | Lim | G11C 11/4074 |
| | | | 365/222 |
| 2019/0324690 A1* | 10/2019 | Jin | G06F 12/0292 |
| 2019/0369893 A1* | 12/2019 | Ross | G06F 3/0604 |

OTHER PUBLICATIONS

EP Patent Application No. 18921860.5—Extended European Search Report, dated Feb. 7, 2022, 9 pages.

KR Patent Application No. 10-2020-7036770—Korean Office Action and Search Report, dated Apr. 15, 2022, with English Translation, 23 pages.

KR Patent Application No. 10-2020-7036770—Korean Office Action dated Oct. 20, 2022 and English translation, 10 pages.

Chinese patent office, "China Office Action," issued in connection with China Patent Application No. 201880093692.5 dated Nov. 8, 2023 (7 pages).

\* cited by examiner

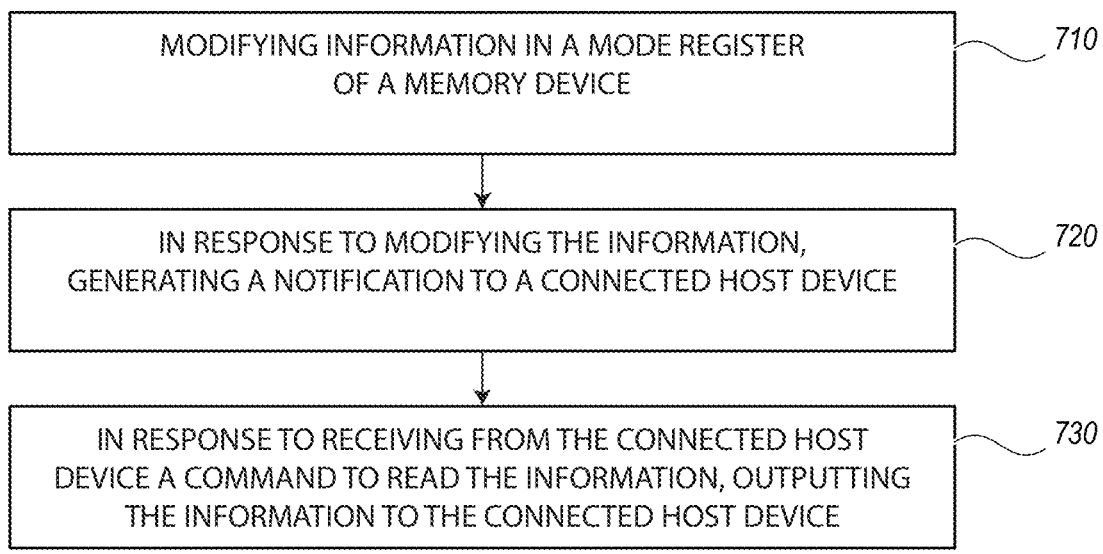

METHODS FOR GENERATING NOTIFICATIONS FOR UPDATED INFORMATION FROM MODE REGISTERS OF A MEMORY DEVICE TO A HOST AND MEMORY DEVICES AND SYSTEMS EMPLOYING THE SAME

CROSS-REFERENCE TO RELATED APPLICATIONS

This application claims the benefit of U.S. Provisional Application No. 62/680,434, filed Jun. 4, 2018, which is incorporated herein by reference in its entirety.

This application contains subject matter related to an U.S. Patent Application by Frank F. Ross titled "METHODS FOR ASYNCHRONOUSLY SIGNALING UPDATED INFORMATION FROM A MEMORY DEVICE TO A HOST AND MEMORY DEVICES AND SYSTEMS EMPLOYING THE SAME". The related application is assigned to Micron Technology, Inc., and is identified as U.S. application Ser. No. 16/029,269, filed Jul. 6, 2018. The subject matter thereof is incorporated herein by reference thereto.

TECHNICAL FIELD

The present disclosure generally relates to memory devices and systems, and more particularly to methods for asynchronously signaling updated information from a memory device to a host and memory devices and systems employing the same.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

FIG. 7 is a flow chart illustrating a method of operating a memory system in accordance with an embodiment of the present technology.

DETAILED DESCRIPTION

Many memory devices, such as double data rate (DDR) DRAM devices, are capable of operating in a variety of modes (e.g., at different clock speeds, with different refresh rates, etc.). In many cases, various operating parameters of the memory device (e.g., voltage, temperature, device age, etc.) may be utilized to determine an appropriate mode. In some memory devices, a connected host may periodically poll one or more of these operating parameters of a memory device to determine whether to adjust the mode. For example, a connected host may poll the device temperature (e.g., or information corresponding to the device temperature) to determine whether to modify the refresh rate of the device. The polling of the device temperature may require a dedicated command on the command/address bus of the memory device, and the polling may be frequent enough to adversely impact (e.g., via congestion) the command/address bus.

Accordingly, several embodiments of the present technology are directed to memory devices, systems including memory devices, and methods of operating memory devices in which a memory device can asynchronously indicate to a connected host that information in a mode register has been changed, obviating the need for repeated polling of the information and thereby reducing both command/address bus and data bus bandwidth consumption. In one embodiment, a memory device comprises a memory; a mode register storing information corresponding to the memory; and circuitry configured to, in response to the information in the mode register being modified by the memory device, generate a notification to a connected host device.

Figure 1:
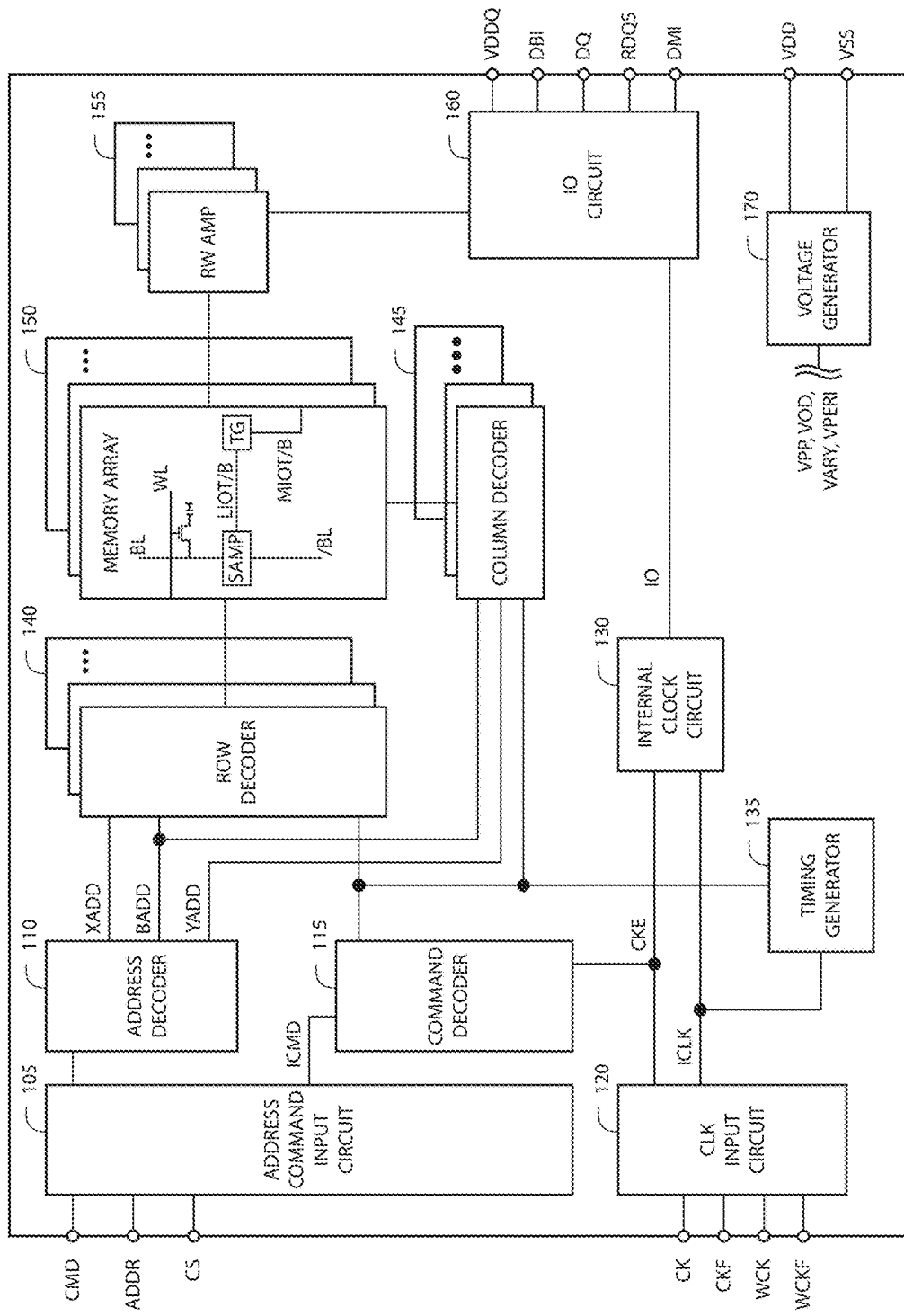
FIG. 1 is a simplified block diagram schematically illustrating a memory device in accordance with an embodiment of the present technology.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

Memory devices such as the memory device 100 of FIG. 1 can be capable of operating in a variety of modes (e.g., at different clock speeds, with different refresh rates, etc.). In many cases, various operating parameters of the memory device 100 (e.g., voltage, temperature, device age, etc.) may be stored in a mode register thereof and utilized (e.g., by a connected host device) to determine an appropriate mode. For example, a connected host may periodically poll one or more of these operating parameters of the memory device 100 to determine whether to adjust the mode (e.g., increasing the refresh rate due to an elevated device temperature, or reducing the refresh rate due to a reduced device temperature).

Figure 2:
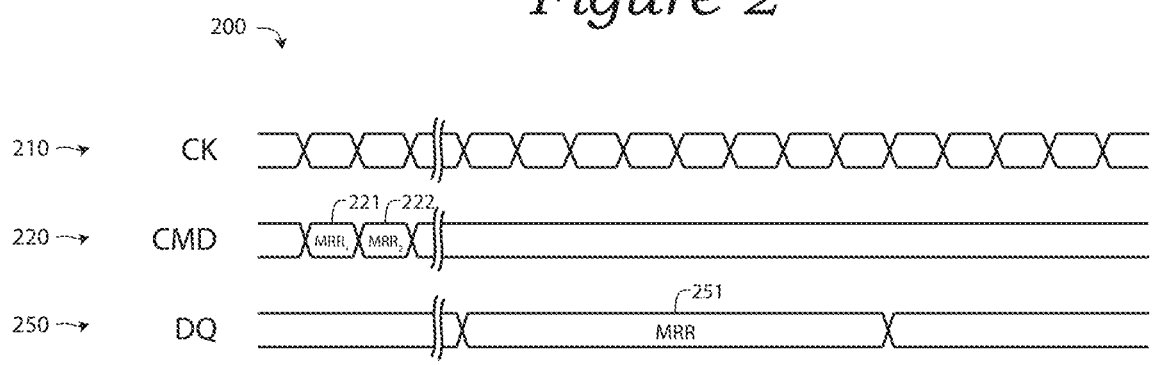
FIGS. 2 and 3 are simplified timing diagrams schematically illustrating the operation of memory devices and systems.

One approach to polling operating parameters of a memory device includes a host sending a dedicated command to the memory device to perform a mode register read operation and to output values therefrom on the data bus of the memory device. For example, as can be seen with reference to the simplified timing diagram 200 illustrated in FIG. 2, in response to a host device providing, on a command/address bus 220, a mode register read command (comprising first a first $MRR_1$ portion 222 and a second $MRR_2$ portion 223), the memory device outputs (e.g., after a predetermined delay) mode register read (MRR) data 251 to the host device over a data bus 250 thereof. As can be seen with reference to FIG. 2, the mode register read command consumes two cycles of the device clock 210 on the command/address bus 320, and the output of the mode register read command consumes eight cycles of the device clock 210 on the data bus 250.

Figure 3:
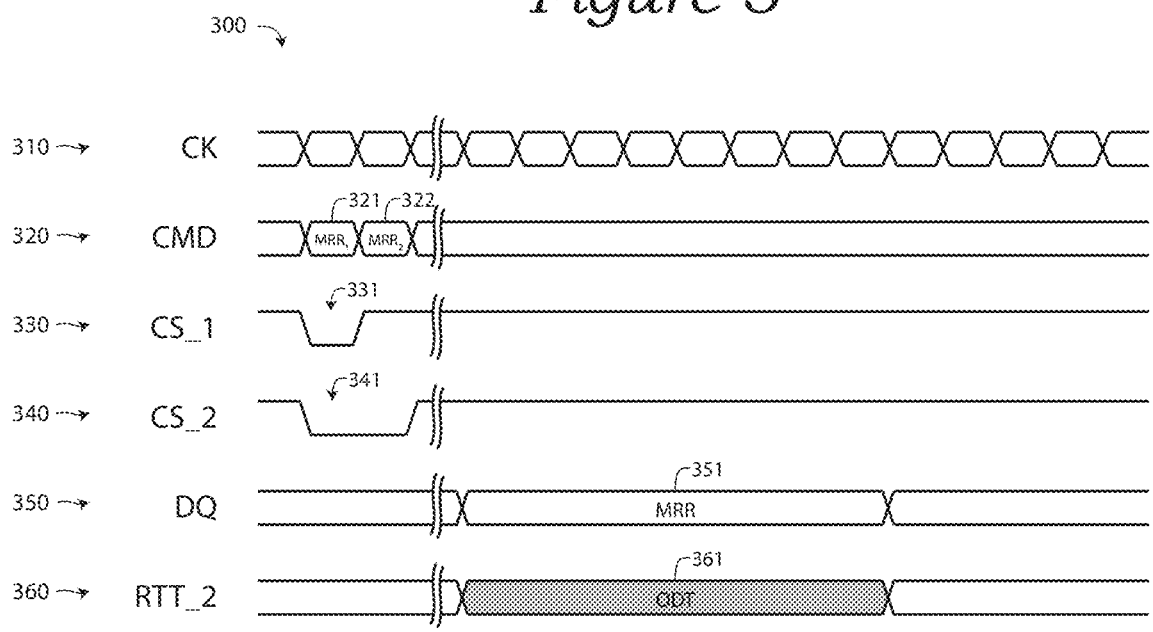

FIG. 3 is likewise a simplified timing diagram schematically 300 illustrating the operation of a memory system with multiple memory portions (e.g., channels, dies, ranks, banks, etc.). As can be seen with reference FIG. 3, in response to a host device providing, on a command/address bus 320, a mode register read command (comprising first a first $MRR_1$ portion 322 and a second $MRR_2$ portion 323) to a first memory portion (e.g., as indicated by asserting a low chip-select signal 331 on a first chip select terminal 330 during the first clock cycle of the mode register read command), the first memory portion outputs (e.g., after a predetermined delay) MRR data 351 to the host device over a data bus 350 of the memory device. To prevent degradation of the MRR data 351 over the shared data bus, the second memory portion 360 can be instructed (e.g., by asserting low chip-select signal 341 on a second chip select terminal 340 during both clock cycles of the mode register read command) to provide on-die termination (ODT) 361 during the transmission of the MRR data 351. As can be seen with reference to FIG. 3, the mode register read command consumes two cycles of the device clock 310 on the command/address bus 320, and the output of the mode register read command consumes eight cycles of the device clock 310 on the data bus 350.

In view of the frequency with which the operating parameters of the memory device stored in a mode register may be polled by a connected host device (e.g., in some cases as frequently as refresh commands are sent), the consumption of command/address bus bandwidth by mode register read commands and of data bus bandwidth by the response to those commands may rise to disadvantageous levels. This is especially compounded by the high likelihood that in response to any particular polling request, the data in the mode register has probably not changed since the last polling request. Accordingly, embodiments of the present technology may solve the foregoing problems by providing a way for a memory device to indicate to a connected host device that updated information is available in a mode register, triggering the host device to poll the operating parameters of the memory device in response, thereby reducing the consumption of command/address and bus bandwidth that would otherwise be consumed by polling requests and responses for periods of time in which the mode register contents have not changed.

Figure 4:
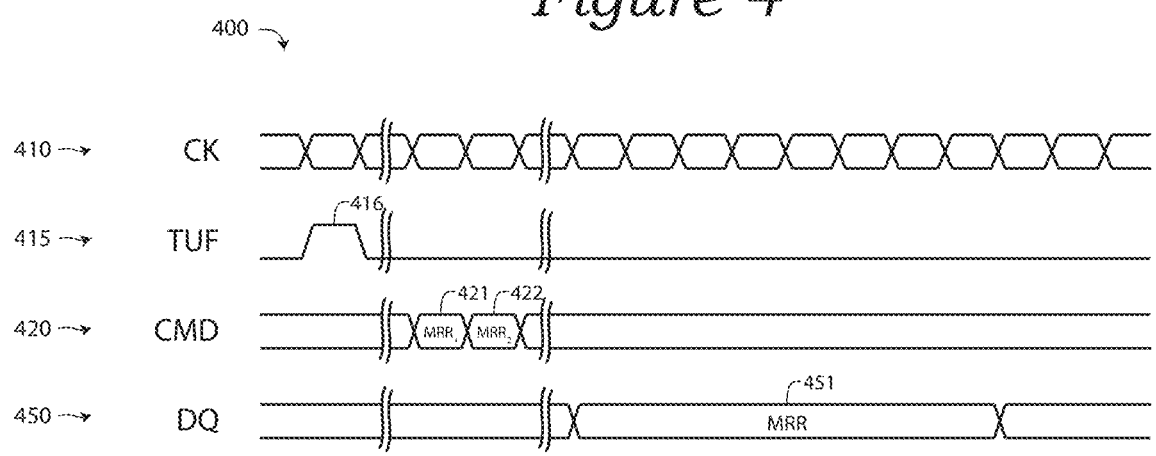
FIGS. 4 through 6 are simplified timing diagrams schematically illustrating the operation of memory devices and systems in accordance with embodiments of the present technology.

Turning to FIG. 4, a simplified timing diagram 400 schematically illustrates the operation of a memory device in accordance with an embodiment of the present technology. As can be seen with reference to FIG. 4, the memory device can, in response to updating information in a mode register thereof, send to a connected host a notification, such as notification 416, on an external terminal of the device, such as the temperature update flag "TUF" terminal 415. The notification 416 can last a predetermined number of cycles of the memory clock 410 (e.g., a single cycle as illustrated in timing diagram 400, or a greater number of cycles, such as 2, 3, 5, 10, 16, etc.), providing sufficient time for the host to detect it. In response to detecting the notification 416, the connected host device can thereafter send a mode register read command (comprising first a first $MRR_1$ portion 421 and a second $MRR_2$ portion 422) instructing the memory device to output MRR data 451 to the host device over a data bus 450 of the memory device. The connected host device, by relying upon the notification from the memory device to indicate when updated information is available, can forego repeatedly polling the device over periods of time in which the information is unchanged, thereby saving both command/address bus and data bus bandwidth.

In accordance with one aspect of the present technology, the TUF terminal can be a dedicated external terminal used solely to signal an update to the information. In some embodiments, however, the notification may be provided on a shared terminal also dedicated to other functions, such as loopback DQ (LBDQ) and/or loopback DQS (LBDQS) terminals.

Figure 5:
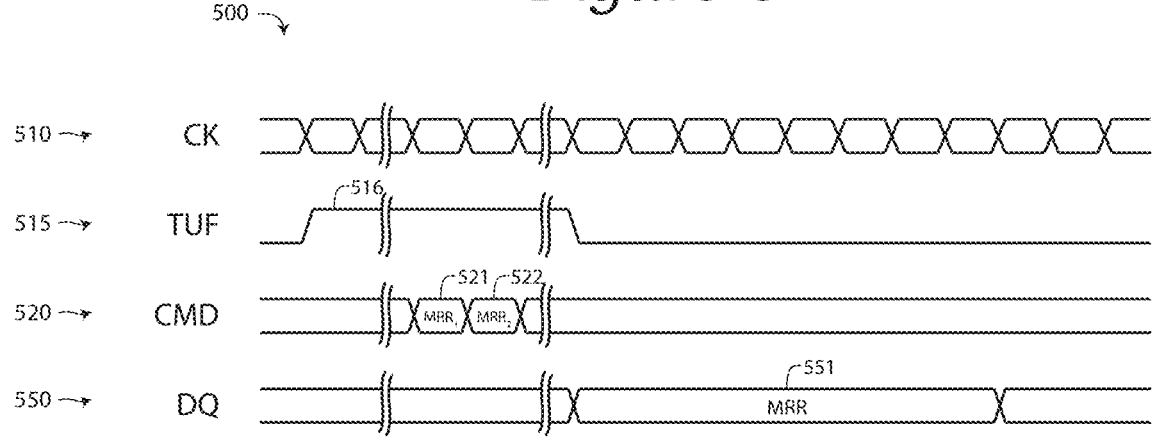

Although in the example illustrated and described in FIG. 4, a memory device is shown as providing a notification that lasts for a predetermined number of clock cycles, in another embodiment of the present technology, a notification signal at an external terminal of the memory device can persist until a predetermined response from the connected host device is received. For example, FIG. 5 schematically illustrates the operation of a memory device in accordance with an embodiment of the present technology by way of a simplified timing diagram 500. As can be seen with reference to FIG. 5, the memory device can, in response to updating information in a mode register thereof, send to a connected host a notification, such as notification 516, on an external terminal of the device, such as the temperature update flag "TUF" terminal 515. The notification 516 can last until the host device sends a predetermined response, such as a mode register read command (comprising first a first $MRR_1$ portion 521 and a second $MRR_2$ portion 522) instructing the memory device to output MRR data 551 to the host device over a data bus 550 of the memory device. In addition to sending the MRR data 551, the memory device terminates the notification 516.

Figure 6:
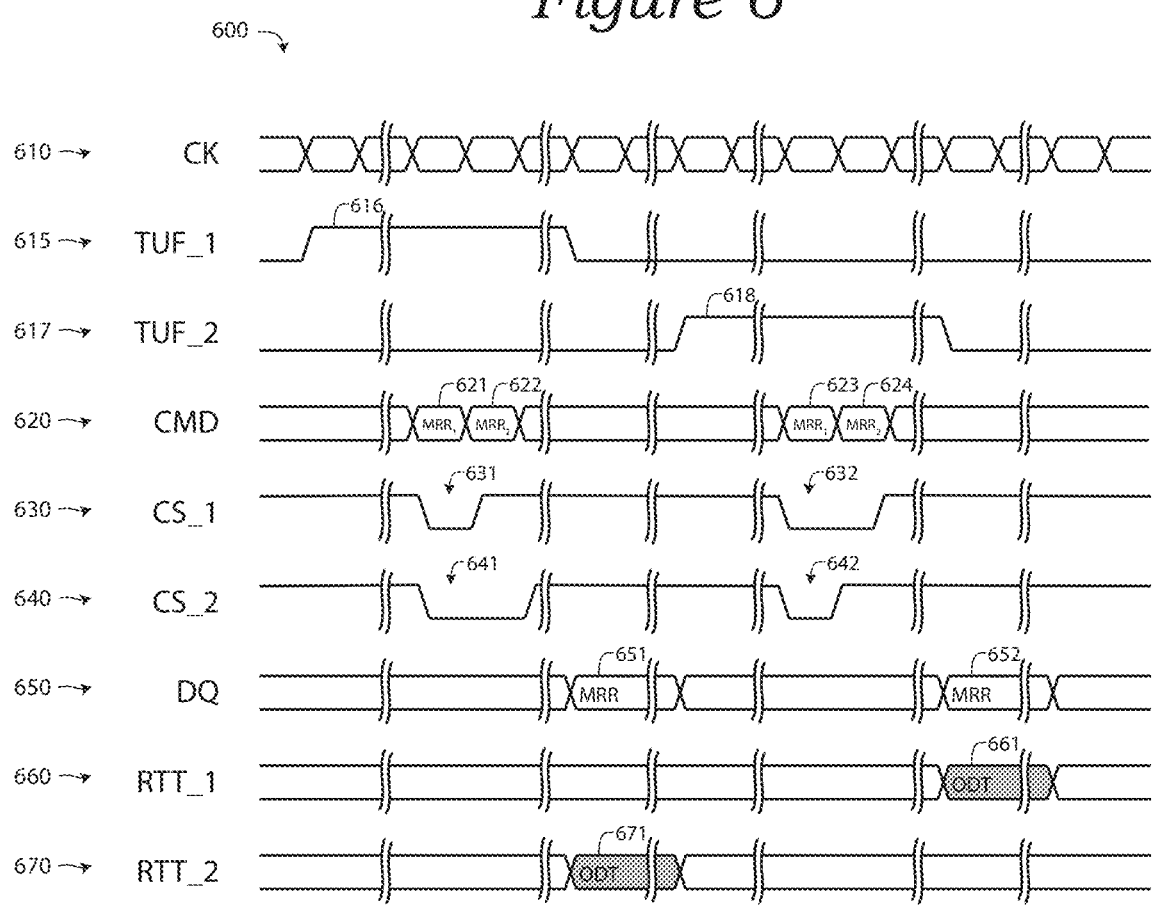

Turning to FIG. 6, a simplified timing diagram 600 schematically illustrates the operation of a memory system including multiple memory portions (e.g., dies, devices, channels, ranks, banks, etc.) in accordance with an embodiment of the present technology. As can be seen with reference to FIG. 6, the memory device can, in response to updating information in a mode register corresponding to a first one of the portions thereof, send to a connected host a notification, such as notification 616, on an external terminal of the device, such as the first temperature update flag "TUF_1" terminal 615. The notification 616 can last until the host device sends a predetermined response, such as a mode register read command (comprising first a first MRR$_1$ portion 621 and a second MRR$_2$ portion 622) to the first memory portion (e.g., as indicated by asserting a low chip-select signal 631 on a first chip select terminal 630 during the first clock cycle of the mode register read command), instructing the memory device to output MRR data 651 from the first memory portion to the host device over a data bus 650 of the memory device. To prevent degradation of the MRR data 651 over the shared data bus, the second memory portion 670 can be instructed (e.g., by asserting low chip-select signal 641 on a second chip select terminal 640 during both clock cycles of the mode register read command) to provide on-die termination (ODT) 671 during the transmission of the MRR data 651. In addition to sending the MRR data 651, the memory device terminates the notification 616.

As can be seen with reference to FIG. 6, a memory system including multiple memory portions (e.g., dies, devices, channels, ranks, banks, etc.) can include multiple external terminals for separately signaling the status of updated information (e.g., in different mode registers) corresponding to the different memory portions. In the example of FIG. 6, the memory device can, in response to updating information in a mode register corresponding to a second one of the portions thereof, send to a connected host a notification, such as notification 618, on an external terminal of the device, such as the second temperature update flag "TUF_2" terminal 617. The notification 618 can last until the host device sends a predetermined response, such as a mode register read command (comprising first a first MRR$_1$ portion 623 and a second MRR$_2$ portion 624) to the second memory portion (e.g., as indicated by asserting a low chip-select signal 642 on a second chip select terminal 640 during the first clock cycle of the mode register read command), instructing the memory device to output MRR data 652 from the second memory portion to the host device over a data bus 650 of the memory device. To prevent degradation of the MRR data 652 over the shared data bus, the first memory portion 660 can be instructed (e.g., by asserting low chip-select signal 632 on a first chip select terminal 630 during both clock cycles of the mode register read command) to provide on-die termination (ODT) 661 during the transmission of the MRR data 652. In addition to sending the MRR data 652, the memory device terminates the notification 618.

FIG. 7 is a flow chart illustrating a method of operating a memory device in accordance with an embodiment of the present technology. The method includes modifying information in a mode register of a memory device (box 710). The method further includes, in response to modifying the information, generating a notification to a connected host device (box 720). According to one aspect of the present disclosure, the generating features of box 720 may be implemented with IO circuit 160 and/or the terminals connected thereto, as illustrated in FIG. 1 in greater detail, above. The method can further include, in response to receiving from the connected host device a command to read the information, outputting the information to the connected host device (box 730). According to one aspect of the present disclosure, the outputting features of box 730 may be implemented with IO circuit 160 and/or the terminals connected thereto, as illustrated in FIG. 1 in greater detail, above.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

I claim:

1. A memory device, comprising:
a memory;
a mode register storing information corresponding to a temperature of the memory; and
circuitry configured to:
output a flag and the information corresponding to the temperature to a connected host device based at least in part on the information in the mode register being modified by the memory device, the flag indicating that the information corresponding to the temperature has been modified; and
refresh the memory device at a refresh rate based at least in part on outputting the flag and the information corresponding to the temperature.

2. The memory device of claim 1, wherein the flag comprises a changed voltage at an external terminal of the memory device that persists for a predetermined duration or until a predetermined response is received from the connected host device.

3. The memory device of claim 1, wherein the information corresponds to the refresh rate of the memory.

4. The memory device of claim 2, wherein the predetermined response comprises a command to read the information stored in the mode register.

5. The memory device of claim 1, wherein the flag is configured to indicate to the connected host device that the information has been modified.

6. The memory device of claim 2, wherein the predetermined duration is a predetermined number of clock cycles of the memory device.

7. The memory device of claim 2, wherein the external terminal is dedicated to providing the flag.

8. A method of operating a memory device, comprising:
modifying information in a mode register of the memory device, wherein the information corresponds to a temperature of a memory of the memory device;
outputting a flag and the information corresponding to the temperature to a connected host device based at least in part on the information in the mode register being modified by the memory device, the flag indicating that the information corresponding to the temperature has been modified; and
refreshing the memory device at a refresh rate based at least in part on outputting the flag and the information corresponding to the temperature.

9. The method of claim 8, wherein outputting the flag comprises changing a voltage at an external terminal of the memory device and maintaining the changed voltage for a predetermined duration or until a predetermined response is received from the connected host device.

10. The method of claim 8, wherein the information corresponds to the refresh rate of the memory.

11. The method of claim 9, wherein the predetermined response comprises a command to read the information stored in the mode register.

12. The method of claim 8, wherein the flag is configured to indicate to the connected host device that the information has been modified.

13. The method of claim 8, further comprising, in response to receiving from the connected host device a command to read the information stored in the mode register, outputting the information to the connected host device.

14. The method of claim 9, wherein the predetermined duration is a predetermined number of clock cycles of the memory device.

15. The method of claim 9, wherein the external terminal is dedicated to providing the flag.

16. A memory device, comprising:
a memory;
a mode register storing information corresponding to a temperature of the memory; and
circuitry configured to output a flag and the information corresponding to the temperature to a connected host device based at least in part on the information in the mode register being modified by the memory device, the flag indicating that the information corresponding to the temperature has been modified, wherein the circuitry is configured to refresh the memory device at a refresh rate based at least in part on outputting the flag and the information corresponding to the temperature.

17. The memory device of claim 16, wherein the flag comprises a changed voltage at an external terminal of the memory device that persists for a predetermined duration or until a predetermined response is received from the connected host device, and wherein the predetermined response comprises a command to read the information stored in the mode register.

18. The memory device of claim 16, wherein the flag is configured to indicate to the connected host device that the information has been modified.

19. The memory device of claim 16, wherein the flag comprises a changed voltage at an external terminal of the memory device that persists for a predetermined duration or until a predetermined response is received from the connected host device, and wherein the predetermined duration is a predetermined number of clock cycles of the memory device.

20. The memory device of claim 16, wherein the flag comprises a changed voltage at an external terminal of the memory device that persists for a predetermined duration or until a predetermined response is received from the connected host device, and wherein the external terminal is dedicated to providing the flag.

* * * * *